(12) United States Patent
McMillin et al.

(10) Patent No.: US 9,997,381 B2
(45) Date of Patent: Jun. 12, 2018

(54) HYBRID EDGE RING FOR PLASMA WAFER PROCESSING

(71) Applicant: Lam Research Corporation, Fremont, CA (US)

(72) Inventors: Brian McMillin, Pleasanton, CA (US); Arthur Sato, San Jose, CA (US); Neil Benjamin, East Palo Alto, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 0 days. days.

(21) Appl. No.: 14/175,509

(22) Filed: Feb. 7, 2014

(65) Prior Publication Data

US 2014/0235063 A1    Aug. 21, 2014

Related U.S. Application Data

(60) Provisional application No. 61/766,028, filed on Feb. 18, 2013.

(51) Int. Cl.
*H01L 21/67* (2006.01)
*H01J 37/32* (2006.01)
(Continued)

(52) U.S. Cl.
CPC .. *H01L 21/67069* (2013.01); *H01J 37/32009* (2013.01); *H01J 37/32082* (2013.01);
(Continued)

(58) Field of Classification Search
CPC ................................................ H01J 37/32651
(Continued)

(56) References Cited

U.S. PATENT DOCUMENTS 5,292,399 A * 3/1994 Lee .................. H01L 21/67069
156/345.47
5,476,548 A * 12/1995 Lei et al. ....................... 118/728
(Continued)

FOREIGN PATENT DOCUMENTS

CN         1373899 A    10/2002
CN         1531739 A     9/2004
(Continued)

OTHER PUBLICATIONS

Office Action dated Dec. 15, 2015 in corresponding Chinese Patent Application No. 201410053976.5 (18 pages).
(Continued)

*Primary Examiner* — Karla A Moore
*Assistant Examiner* — Tiffany Z Nuckols

(57) ABSTRACT

An edge ring assembly is disclosed for use in a plasma processing chamber, which includes an RF conductive ring positioned on an annular surface of a base plate and configured to surround an upper portion of the baseplate and extend underneath an outer edge of a wafer positioned on the upper surface of the baseplate, and a wafer edge protection ring positioned above an upper surface of the RF conductive ring and configured to extend over the outer edge of the wafer. The protection ring has an inner edge portion with a uniform thickness, which extends over the outer edge of the wafer, a conical upper surface extending outward from the inner edge portion to a horizontal upper surface, an inner annular recess which is positioned on the upper surface of the RF conductive and configured to extend over the outer edge of the wafer.

26 Claims, 9 Drawing Sheets

(51) Int. Cl.
*H01L 21/3065* (2006.01)
*H01L 21/768* (2006.01)

(52) U.S. Cl.
CPC .... *H01J 37/32642* (2013.01); *H01L 21/3065* (2013.01); *H01L 21/30655* (2013.01); *H01L 21/76898* (2013.01)

(58) Field of Classification Search
USPC ............... 118/728–732; 156/345.51–345.55
See application file for complete search history.

(56) References Cited

U.S. PATENT DOCUMENTS

| | | | |
|---|---|---|---|
| 5,534,110 A | | 7/1996 | Lenz et al. |
| 5,632,873 A | * | 5/1997 | Stevens .................. C23C 14/50 118/503 |
| 5,740,009 A | | 4/1998 | Pu et al. |
| 5,800,686 A | | 9/1998 | Littau et al. |
| 5,805,408 A | | 9/1998 | Maraschin et al. |
| 5,824,605 A | | 10/1998 | Chen et al. |
| 5,922,133 A | * | 7/1999 | Tepman .................. C23C 14/50 118/503 |
| 5,948,704 A | | 9/1999 | Benjamin et al. |
| 5,997,651 A | * | 12/1999 | Matsuse ................ C23C 16/455 118/715 |
| 5,998,932 A | | 12/1999 | Lenz |
| 6,013,155 A | | 1/2000 | McMillin et al. |
| 6,013,984 A | | 1/2000 | Ellinger et al. |
| 6,039,836 A | | 3/2000 | Dhindsa et al. |
| 6,051,122 A | * | 4/2000 | Flanigan ............. C23C 16/4585 118/720 |
| 6,168,668 B1 | * | 1/2001 | Yudovsky .................... 118/715 |
| 6,231,674 B1 | | 5/2001 | Chen et al. |
| 6,296,712 B1 | * | 10/2001 | Guo ..................... C23C 16/455 118/500 |
| 6,300,651 B1 | | 10/2001 | Kato |
| 6,328,808 B1 | * | 12/2001 | Tsai .................. C23C 16/45521 118/500 |
| 6,333,272 B1 | | 12/2001 | McMillin et al. |
| 6,344,105 B1 | * | 2/2002 | Daugherty et al. ...... 156/345.51 |
| 6,355,108 B1 | * | 3/2002 | Won et al. .................... 118/728 |
| 6,383,931 B1 | | 5/2002 | Flanner et al. |
| 6,409,896 B2 | * | 6/2002 | Crocker ................ 118/723 E |
| 6,489,249 B1 | | 12/2002 | Mathad et al. |
| 6,554,954 B2 | * | 4/2003 | Ma et al. ................ 156/345.51 |
| 6,824,627 B2 | | 11/2004 | Dhindsa et al. |
| 7,208,326 B2 | | 4/2007 | Rennie et al. |
| 7,578,945 B2 | | 8/2009 | Vahedi et al. |
| 8,485,128 B2 | | 7/2013 | Kellogg et al. |
| 9,111,729 B2 | | 8/2015 | Gottscho et al. |
| 2004/0163762 A1 | * | 8/2004 | Iizuka et al. ............ 156/345.39 |
| 2010/0108261 A1 | | 5/2010 | Augustino et al. |
| 2011/0159211 A1 | * | 6/2011 | Du Bois .................. C23C 16/04 427/569 |
| 2012/0003388 A1 | * | 1/2012 | Tzu ..................... C23C 16/4412 427/250 |
| 2012/0061351 A1 | * | 3/2012 | Ohata ............... H01J 37/32091 216/67 |

FOREIGN PATENT DOCUMENTS

| | | |
|---|---|---|
| CN | 1822317 A | 8/2006 |
| TW | 201126601 A | 8/2011 |
| TW | 201207935 A | 2/2012 |
| TW | 201237214 A1 | 9/2012 |

OTHER PUBLICATIONS

Office Action dated Nov. 7, 2017 in corresponding Taiwanese Patent Application No. 103105157 (7 pages).

* cited by examiner

HYBRID EDGE RING FOR PLASMA WAFER PROCESSING

CROSS REFERENCE TO RELATED APPLICATIONS

This application claims priority under 35 U.S.C. § 119(e) to U.S. Provisional Application No. 61/766,028, filed on Feb. 18, 2013, the entire contents of which is incorporated herein by reference thereto.

BACKGROUND

In the field of conductor (metal) processing, plasma processing chambers are commonly used to etch one or more layers formed on a substrate. During etching, the substrate is supported on a substrate support surface within the chamber. Substrate supports can include edge rings positioned around the substrate support (e.g., around the substrate) for confining plasma to the volume above the substrate and/or to protect the substrate support, which typically includes a clamping mechanism, from erosion by the plasma. The edge rings, sometimes called focus rings, can be sacrificial (e.g., consumable) parts. Conductive and non-conductive edge rings are described in commonly-owned U.S. Pat. Nos. 5,805,408; 5,998,932; 6,013,984; 6,039,836 and 6,383,931.

During plasma etching, plasma is formed above the surface of a substrate by adding large amounts of energy to a gas (or gas mixture) at low pressure. The plasma may contain ions, free radicals, and neutral species with high kinetic energies. By adjusting the electrical potential of the substrate, charged species in the plasma can be directed to impinge upon the surface of the substrate and thereby remove material (e.g., atoms) therefrom.

SUMMARY

An edge ring assembly for use in a plasma processing chamber is disclosed, comprising: an RF conductive ring positioned on an annular surface of a base plate and configured to surround an upper portion of the baseplate and extend underneath an outer edge of a wafer positioned on the upper surface of the baseplate; and a wafer edge protection ring positioned above an upper surface of the RF conductive ring and configured to extend over the outer edge of the wafer, the wafer edge protection ring having an inner edge portion with a uniform thickness, which is configured to extend over the outer edge of the wafer, a conical upper surface extending outward from the inner edge portion to a horizontal upper surface, and an inner annular recess which is positioned on the upper surface of the RF conductive ring and configured to extend over the outer edge of the wafer.

A lower electrode assembly for use in a plasma processing chamber is disclosed, comprising: a baseplate configured to receive a wafer on an upper surface thereof; a bottom ring supported on an annular surface of the baseplate and surrounding the baseplate; an RF conductive ring positioned on an upper surface of the bottom ring and surrounding an upper portion of the baseplate and configured to extend underneath an outer edge of a wafer positioned on the upper surface of the baseplate; a wafer edge protection ring positioned above an upper surface of the RF conductive ring and configured to extend over the outer edge of the wafer; a quartz ring surrounding an outer surface of the baseplate and an outer edge of the bottom ring; and a centering ring surrounding an outer edge of the quartz ring and extending upward to a center annular recess within the wafer edge protection ring.

A method for reducing profile striations on a wafer processed in a plasma processing chamber is disclosed, comprising: positioning an RF conductive ring on an upper surface of a baseplate and surrounding an upper portion of the baseplate and extending underneath an outer edge of a wafer positioned on an upper surface of the baseplate; positioning the wafer to be processed on the upper surface of the baseplate; positioning a wafer edge protection ring above an upper surface of the RF conductive ring and extending over an outer edge of the wafer edge protection ring and over the outer edge of the wafer, the wafer edge protection ring having an inner edge portion with a uniform thickness, which extends over the outer edge of the wafer, a conical upper surface extending outward from the inner edge portion to a horizontal upper surface, and an inner annular recess which is positioned on the upper surface of the RF conductive and configured to extend over the outer edge of the wafer; and etching the wafer in the plasma processing chamber.

BRIEF DESCRIPTION OF THE DRAWINGS

The accompanying figures are included to provide a further understanding of the invention, and are incorporated in and constitute a part of this specification. The figures illustrate embodiments of the invention and, together with the description, serve to explain the principles of the invention.

DETAILED DESCRIPTION

Plasma chambers are generally used for etching layers of materials on substrates by supplying an etching gas comprising one or more gases to the chamber and applying energy to the etching gas to energize the gas into a plasma state. Various plasma chamber designs are known wherein radio frequency (RF) energy, microwave energy and/or magnetic fields can be used to produce and sustain medium density or high density plasma.

In such plasma processing chambers process gas is supplied through a suitable arrangement such as a showerhead electrode or gas injection system and a semiconductor substrate supported on a lower electrode is plasma etched by plasma generated by supplying RF energy to the process gas.

For a metal etch process, the lower electrode assembly can be incorporated in a transformer coupled plasma (TCP™) reactor. Transformer coupled plasma reactors, wherein RF energy is inductively coupled into the reactor, are available from Lam Research Corporation, Fremont, Calif. An example of a high-flow plasma reactor that can provide high density plasma is disclosed in commonly-owned U.S. Pat. No. 5,948,704, the disclosure of which is hereby incorporated by reference in its entirety.

Figure 1:
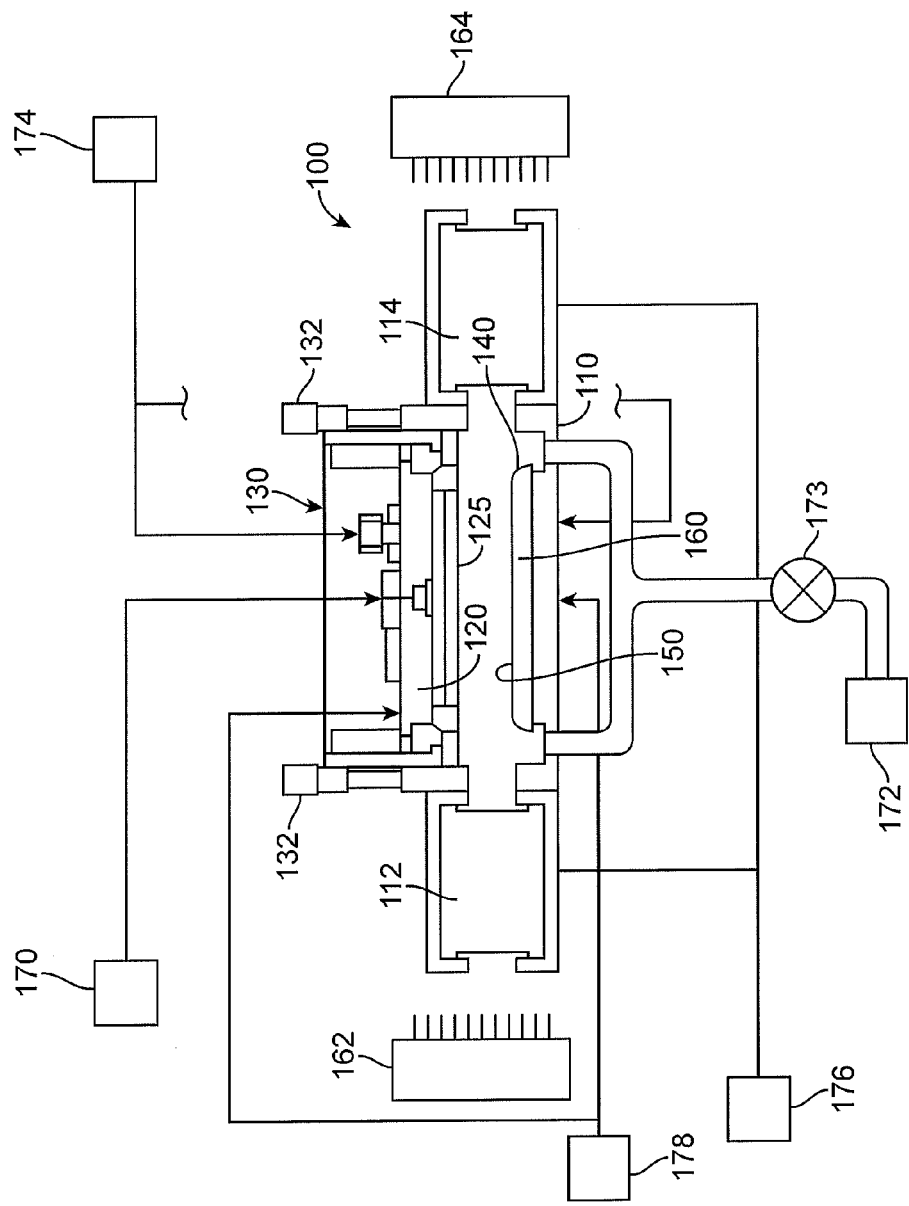
FIG. 1 is an illustration of an exemplary plasma processing apparatus.

An exemplary parallel plate plasma etch reactor is illustrated in FIG. 1. The plasma etch reactor 100 comprises a chamber 110, an inlet load lock 112, and an optional outlet load lock 114, further details of which are described in commonly-owned U.S. Pat. No. 6,824,627, which is hereby incorporated by reference in its entirety. The load locks 112 and 114 (if provided) include transfer devices to transfer substrates such as wafers from a wafer supply 162, through the chamber 110, and out to a wafer receptacle 164. A load lock pump 176 can provide a desired vacuum pressure in the load locks 112 and 114.

A vacuum pump 172 such as a turbo pump is adapted to maintain a desired pressure in the chamber. During plasma etching, the chamber pressure is controlled, and preferably maintained at a level sufficient to sustain a plasma. Too high a chamber pressure can disadvantageously contribute to etch stop while too low a chamber pressure can lead to plasma extinguishment. In a medium density plasma reactor, such as a parallel plate reactor, for example, the chamber pressure can be maintained at a pressure below about 200 mTorr (e.g., less than 100 mTorr or less than 50 mTorr). The vacuum pump can be connected to an outlet in a wall of the reactor and can be throttled by a valve 173 in order to control the pressure in the chamber. Preferably, the vacuum pump is capable of maintaining a pressure within the chamber of less than 200 mTorr while etching gases are flowed into the chamber.

The chamber 110 includes an upper electrode assembly 120 can include an upper electrode 125 (e.g., showerhead electrode), and a lower electrode assembly 140 including a baseplate or lower electrode 160 and a substrate support surface 150 formed in an upper surface thereof. The upper electrode assembly 120 is mounted in an upper housing 130. The upper housing 130 can be moved vertically by a mechanism 132 to adjust the gap between the upper electrode 125 and the substrate support surface 150.

An etching gas source 170 can be connected to the housing 130 to deliver etching gas comprising one or more gases to the upper electrode assembly 120. In an exemplary etch reactor, the upper electrode assembly comprises a gas distribution system, which can be used to deliver reactant and/or carrier gases to a region proximate to the surface of a substrate. Gas distribution systems, which can include one or more gas rings, injectors and/or showerheads (e.g., showerhead electrodes), are disclosed in commonly-owned U.S. Pat. Nos. 5,824,605; 6,013,155; 6,300,651; and 6,333,272, the disclosures of which are hereby incorporated by reference in their entirety.

The upper electrode 125 preferably comprises a showerhead electrode, which includes apertures (not shown) to distribute etching gas therethrough. The showerhead electrode 125 can comprise one or more vertically spaced-apart baffle plates that can promote the desired distribution of etching gas. The upper and lower electrodes 125, 160 may be formed of any suitable material such as graphite, silicon, silicon carbide, aluminum (e.g., anodized aluminum), or combinations thereof. A heat transfer liquid source 174 can be connected to the upper electrode assembly 120 and another heat transfer liquid source can be connected to the baseplate 160. While a parallel plate reactor is described above, the edge ring assembly 200 (FIG. 2) as disclosed herein can be used in other plasma processing systems such as inductively coupled plasma chambers.

For through silicon via (TSV) etch, for example, using a Bosch etch process (alternating $SF_6/C_4F_8$ chemistry), the exposed silicon wafer edge requires protection to prevent substrate damage due to undesirable etching at near the edge of the wafer. If, left unprotected, the edge of the wafer will etch, resulting in possible black silicon defects and a weakened wafer edge that can lead to substrate chipping. To protect the wafer edge, an edge protection ring or bottom shadow ring can be used to cover the wafer edge during etching in a TSV etch, for example, on a 2300® Syndion® chamber, which is or is comprised of a TCP reactor. The presence of an edge protection ring can result in detrimental effects on features being etched, such as undesirable via/trench tilt or profile roughness and/or striations on features, for example, within 6 mm of the wafer edge. The feature tilt can be induced by non-perpendicular ion bombardment on the wafer due to the plasma sheath bending near the wafer edge, in part due to the height of the edge protection ring. The striations on the features near the wafer edge can be due, in part, to the reduced efficiency of gas transport in the vicinity of the edge protection ring.

In accordance with an exemplary embodiment, a wafer edge protection ring 300 (FIG. 2) is disclosed for a wafer 220, which can reduce the negative side effects of wafer edge protective ring, including via/trench tilt and profile striations and/or roughness near an outer edge 222 of the wafer 220, for example, the outer 6 mm.

Figure 2:
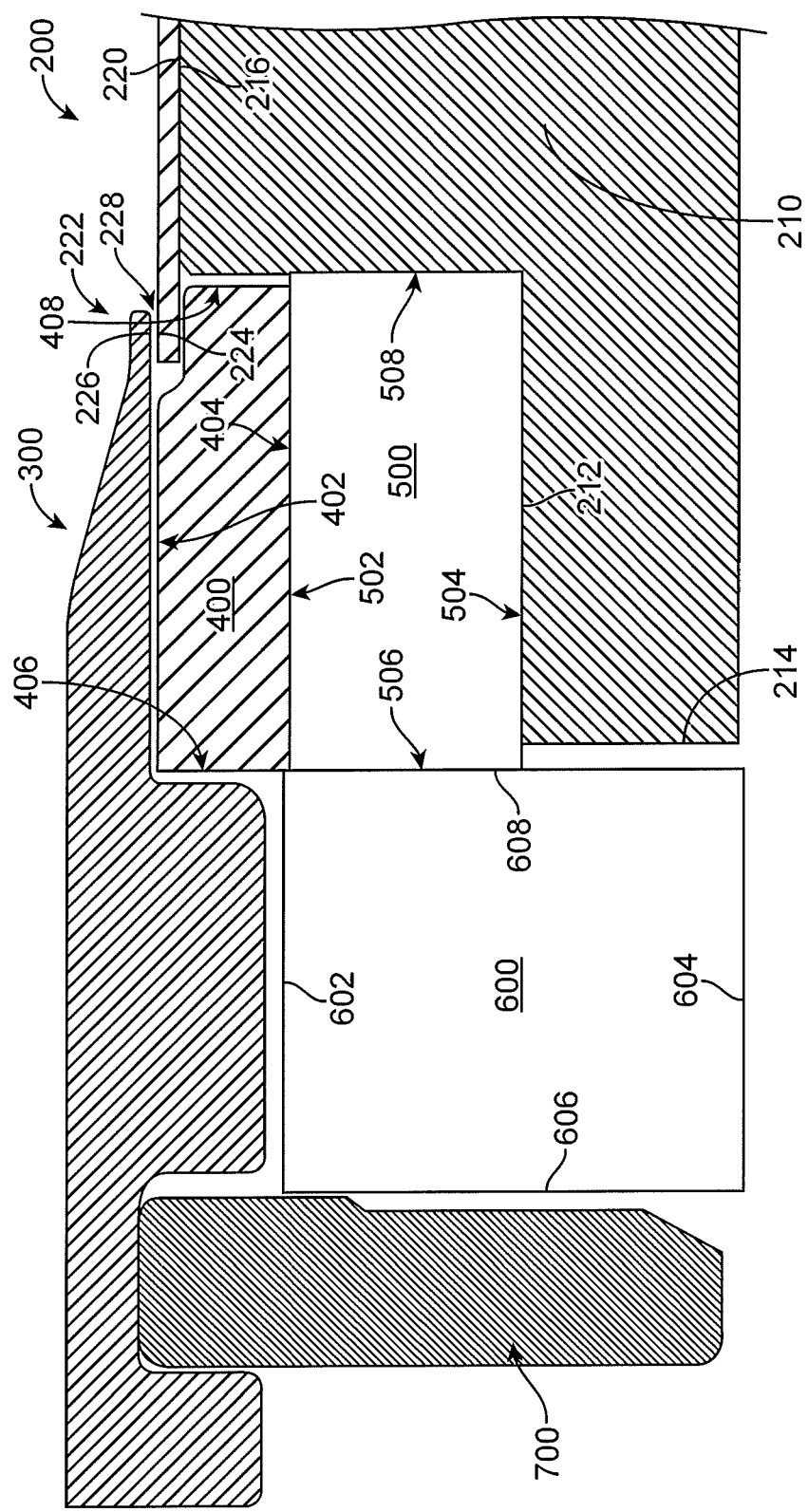
FIG. 2 is a cross-sectional view of an exemplary edge ring assembly in accordance with an exemplary embodiment.

FIG. 2 is a cross-sectional view of a cross-sectional view of an exemplary edge ring assembly 200 in accordance with an exemplary embodiment. As shown in FIG. 2, the edge ring assembly 200 for use in a plasma processing chamber includes a wafer edge protection ring 300, an RF conductive ring 400, and a bottom ring 500. The wafer edge protection ring 300 is positioned above and/or on an upper surface 402 of the RF conductive ring 400. In accordance with an exemplary embodiment, the wafer edge protection ring 300 is configured to extend over the outer edge 222 of the wafer 220. In accordance with an exemplary embodiment, the wafer edge protection ring 300 does not make contact with an upper surface of the wafer 220 during processing.

In accordance with an exemplary embodiment, the thickness of the wafer edge protection ring 300 can be chosen to minimize the tilt of vias near the edge 222 of the wafer 220. However, in some cases there is a tradeoff in that increasing the thickness of the edge protection ring 300 can reduce via tilt, but increases the probability of profile striations. For example, increasing the thickness of the wafer edge protection ring 300 can increase the likelihood of striations observed on the sidewalls. Accordingly, in accordance with an exemplary embodiment, the edge ring assembly 200 as disclosed herein can increase the RF coupling efficiency near the edge of wafer for a chamber configuration by employing a wafer edge protection ring 300, and replacing the substantially insulating dielectric edge ring below the wafer edge protection ring 300 with an RF conductive ring 400.

In accordance with an exemplary embodiment, a lower surface 404 of the RF conductive ring 400 is positioned on an upper surface 502 of the bottom ring 500. The RF conductive ring 400 is configured to surround an upper portion of the baseplate 210 and extend underneath an outer edge of a wafer 220 positioned on an upper surface 216 of the baseplate 210. The RF conductive ring 400 has an upper surface 402, a lower surface 404, an outer edge 406 and an inner edge 408. The bottom ring 500 is configured to be supported on an annular surface 212 of a baseplate 210 and surrounds the baseplate 210. The bottom ring 500 includes the upper surface 502, a lower surface 504, an outer edge 506 and an inner edge 508. In accordance with an exemplary embodiment, the bottom ring 500 is incorporated into the baseplate 210. In accordance with an exemplary embodiment, the baseplate 210 is an electrostatic chuck assembly (ESC).

In accordance with an exemplary embodiment, the assembly 200 can include a quartz ring 600, which surrounds an outer surface 214 of the baseplate 200 and an outer edge 506 of the anodized bottom ring 500. The quartz ring 600 includes an upper surface 602, a lower surface 604, an outer edge 606, and an inner edge 608. In accordance with an exemplary embodiment, a centering ring 700 surrounds an outer edge 606 of the quartz ring 600 and extends upward to a center recess 340 within the wafer edge protection ring 300.

In accordance with an exemplary embodiment, the assembly bottom ring 500 is an aluminum or anodized aluminum bottom ring 500 and the RF conductive ring 400 is a low resistivity SiC edge ring. In accordance with an exemplary embodiment, the RF conductive ring 400 has a resistivity of less than about 100 Ohm-cm. In accordance with an exemplary embodiment, the presence of the RF conductive ring 400 below the wafer edge protection ring 300 can result in increased RF coupling near the wafer edge 220 and through the wafer edge protection ring 300, which, for example, can have a beneficial impact on reducing profile striations for TSV etches using 400 kHz RF bias. In accordance with an exemplary embodiment, the increased RF coupling through the wafer edge protection ring 300 can increase the plasma sheath thickness above the edge protection ring 300, allowing a thinner edge protection ring 300 to be used, without excessive plasma sheath bending.

In accordance with an exemplary embodiment, by providing more RF coupling near the outer edge 222 of the wafer 220, the wafer edge protection ring 300 having a thinner inner edge can improve the gas transport at the edge 222 of the wafer 220, which can results in less profile roughness and striations. In addition, if additional RF coupling is desired, the wafer edge protection ring 300 can be made out of an RF conductive material, for example, silicon carbide (SiC).

In accordance with an exemplary embodiment, the assembly 200 can be used in applications which use a low frequency, for example, less than or equal 2 MHz, bias RF source, because the reduction in RF coupling efficiency can be more prominent at lower RF frequencies, because the capacitive impedance scales as 1/frequency. In addition, increasing the RF coupling through the wafer edge protection ring 300 can increase the plasma sheath thickness and allows a thinner wafer edge protection ring 300 to be used, which minimizes the loss of gas transport efficiency introduced by the presence of the wafer edge protection ring 300.

Figure 3:
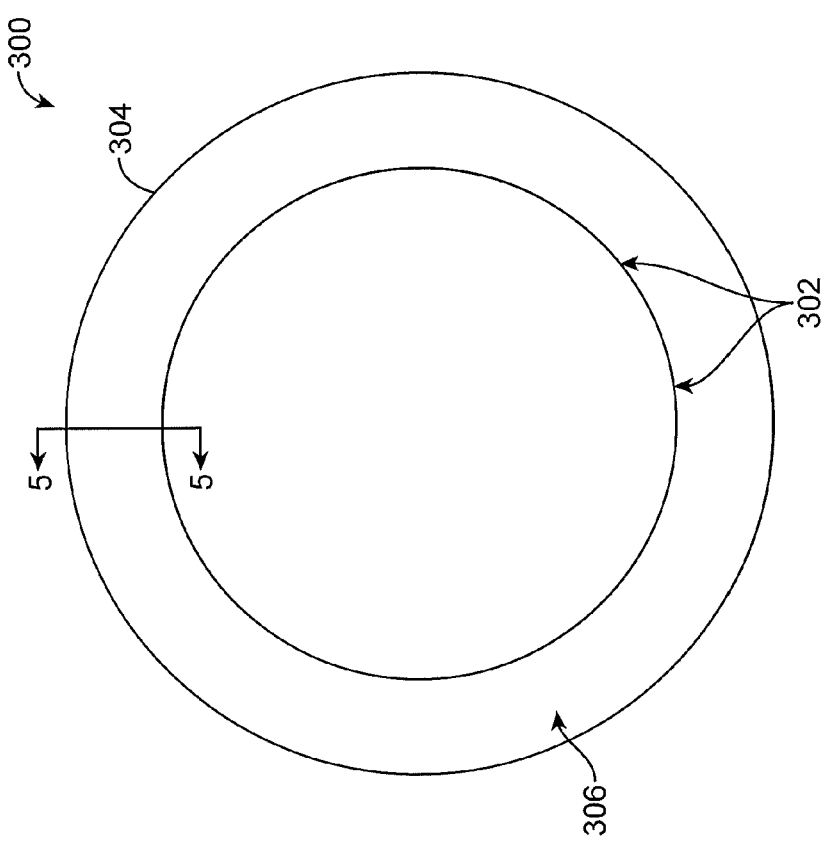
FIG. 3 is a top view of a wafer edge protection ring in accordance with an exemplary embodiment

FIG. 3 is a top view of a wafer edge protection ring 300 in accordance with an exemplary embodiment. As shown in FIG. 3, the wafer edge protection ring 300 is an annular ring having an inner edge 302 and an outer edge 304. The top surface 306 of the edge protection ring 300 has a relatively planar inner portion or inner edge portion 312 (FIG. 5) having relatively uniform thickness, which extends outward to a slightly conical inner portion or upper surface 310, and which extends outward to a second relatively planar portion or horizontal surface 320. In accordance with an exemplary embodiment, the wafer edge protection ring 300 has an inner diameter of about 11.732 inches to 11.736 inches, and an outer diameter of about 16.14 inches.

Figure 4:
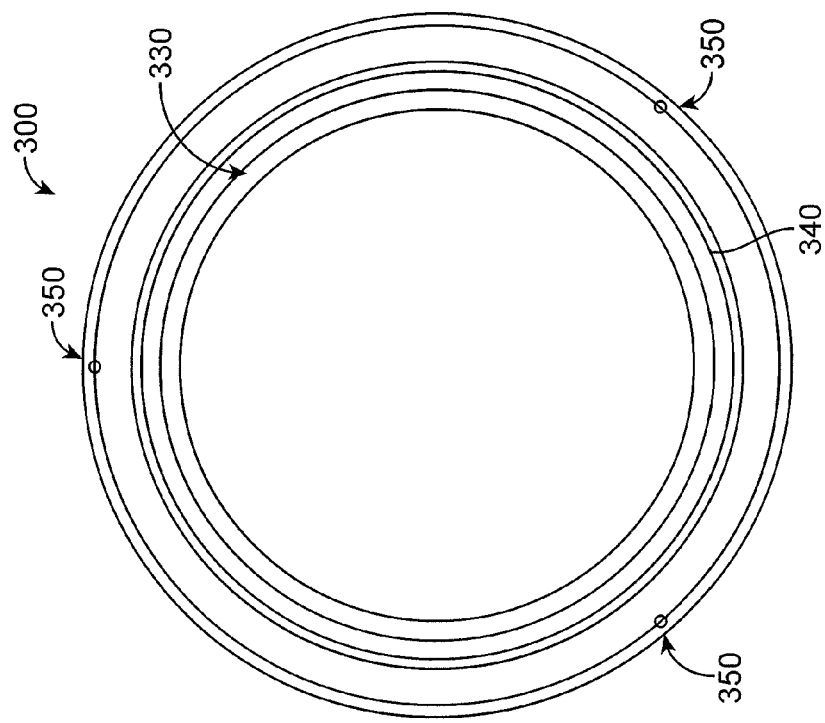
FIG. 4 is a bottom view of the wafer edge protection ring as shown in FIG. 3 in accordance with an exemplary embodiment.

FIG. 4 is a bottom view of the wafer edge protection ring 300 as shown in FIG. 3 in accordance with an exemplary embodiment. As shown in FIG. 4, the wafer edge protection ring 300 including a plurality of recesses 330, 340, 350 on a lower surface thereof, which are configured to receive the corresponding contours and/or upper portions of the RF conductive ring 400, the quartz ring 600, and the centering ring 700. The plurality of recesses 330, 340, 350 can include an inner annular recess 330 which is positioned on and/or rests above, an upper surface 402 of the RF conductive ring 400, a center annular recess 340, which is configured to receive the centering ring 700, and at least three outer recesses 350. Each of the three outer recesses 350 is configured to receive a ceramic lift rod (not shown), which raises the wafer edge protection ring 300 upward during wafer transfer.

Figure 5:
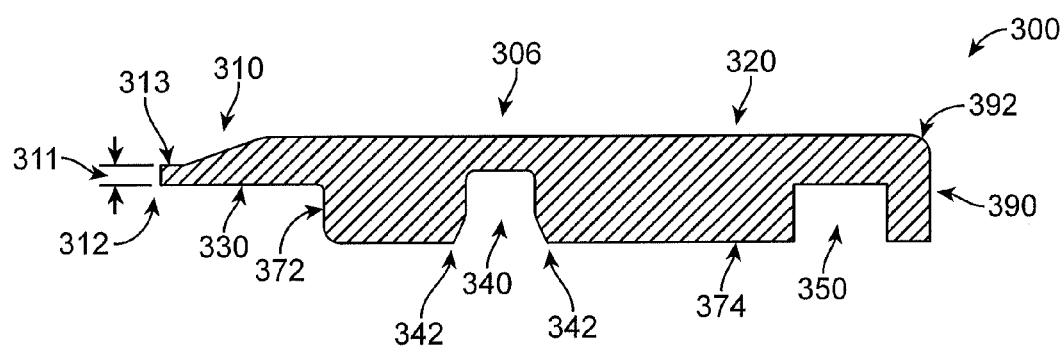
FIG. 5 is a cross-sectional view of the wafer edge protection ring as shown in FIG. 3 along the line 5-5 in accordance with an exemplary embodiment.

FIG. 5 is a cross-sectional view of the wafer edge protection ring 300 as shown in FIG. 3 along the line 5-5 in accordance with an exemplary embodiment. As shown in FIG. 5, the wafer edge protection ring 300 has an inner edge portion 312 having a uniform thickness, which is configured to extend over the outer edge 222 of the wafer 220. In accordance with an exemplary embodiment, the wafer edge protection ring 300 has a conical upper surface 310 extending outward from an upper surface 313 of the inner edge portion 312 to a horizontal upper surface 320. The wafer edge protection ring 300 has an inner annular recess 330 which is positioned and/or rests above, an upper surface of the RF conductive ring 400 and is configured to extend over the upper edge 224 of the wafer. The wafer edge protection ring 300 also includes a center annular recess 340, which is configured to receive the centering ring 700. The center recess 340 can have a pair of slightly round edges on an outer edge 342, which are configured to receive the centering 700.

The wafer edge protection ring 300 also includes at least three recesses 350, each of the recesses configured to receive a ceramic lift rod (not shown), which raises the wafer edge protection ring 300 upward during wafer transfer. In accordance with an exemplary embodiment, the ceramic lift rods raise the wafer edge protection ring 300 upward about 0.5 inches during wafer transfer to the baseplate (or electro static chuck) 210. In accordance with an exemplary embodiment, each of the at least three recesses 350 are preferably cylindrical having a round or circular cross-section.

In accordance with an exemplary embodiment, the inner edge portion 312 of the wafer edge protection ring 300 has a thickness 311 of about 0.030 inches to 0.120 inches. For example, in accordance with an exemplary embodiment, the inner edge portion 312 of the wafer edge protection ring 300 can have a thickness of about 0.030 to about 0.060 inches. In addition, the wafer edge protection ring 300 can be configured to extend about 0.5 mm to 3.0 mm over the outer edge 222 of the wafer 220. For example, in accordance with an exemplary embodiment, the wafer edge protection ring 300 has about 1.0 mm to about 1.2 mm of nominal physical coverage. In addition, the wafer edge protection ring 300 can be configured such that the wafer edge protection ring 300 does not contact the wafer 200 during processing. For example, in accordance with an exemplary embodiment, a gap 228 (FIG. 2) between a lower surface 226 of the wafer edge protection ring 300 and an upper surface 224 of the wafer 220 of a minimum 0.003 inches to 0.020 inches can be provided. For example, in accordance with an exemplary embodiment, the distance or gap 228 between the lower surface 226 of the wafer edge protection ring 300 and the upper surface 224 of the wafer 220 can be about 0.010 inches. In accordance with an exemplary embodiment, the wafer edge protection ring 300 has a thickness of about 0.309 inches extending from the horizontal upper surface 320 to a horizontal lower surface 374.

In accordance with an exemplary embodiment, the wafer edge protection ring 300 is a ceramic, for example, alumina ($Al_2O_3$). In accordance with an exemplary embodiment, the wafer edge protection ring 300 can include an yttrium oxide finish. In accordance with an exemplary embodiment, the wafer edge protection ring 300 can be made out of an RF conductive material.

Figure 6:
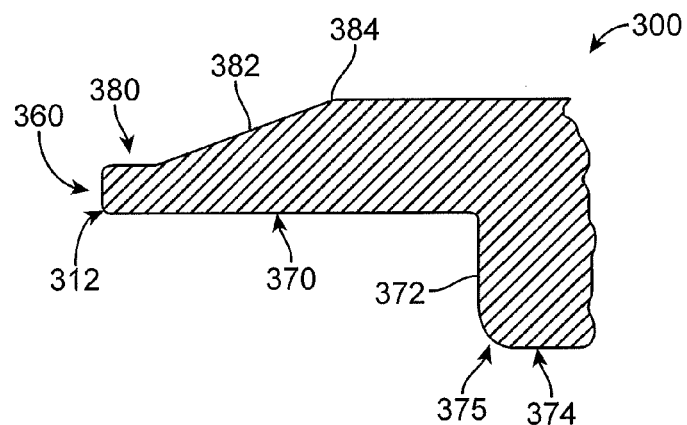
FIG. 6 is a cross-sectional view of an inner edge of the wafer edge protection ring as shown in FIG. 3.

FIG. 6 is a cross-sectional view of the inner edge portion 312 of the wafer edge protection ring 300 as shown in FIG. 3. As shown in FIG. 6, the inner edge portion 312 of the wafer edge protection ring 300 includes a relatively vertical inner wall 360, which extends outward to a relatively horizontal inner lower surface 370 and a relatively horizontal upper surface 380. The relatively horizontal inner lower surface 370 extends outward to an inner vertical wall 372 to the horizontal lower surface 374 of the wafer edge protection ring 300, which extends outward to an outer vertical edge 390 (FIG. 5). In accordance with an exemplary embodiment, the transition from the inner vertical wall 372 to the horizontal lower surface 374 has a rounded edge 375.

In accordance with an exemplary embodiment, the relatively horizontal lower surface 370 extends over the outer edge 222 of the wafer 220 during processing. The relatively horizontal upper surface 380 extends inward about 0.066 inches to an inner conical wall 382, which forms the upper conical portion 310 of the wafer edge protection ring 300. The upper conical portion 310 extends outward to an upper surface 384, which extends outward to the outer vertical edge 390. In accordance with an exemplary embodiment, a transition from the upper surface 384 to the outer vertical edge 390 has a rounded edge 392.

Figure 7:
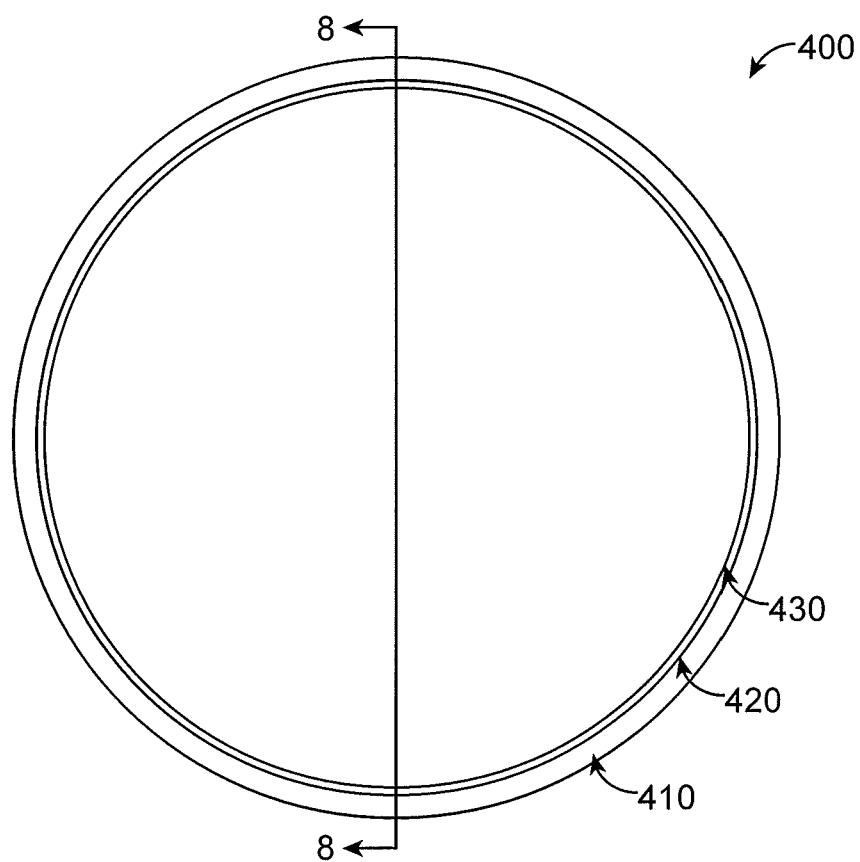
FIG. 7 is top view of a RF conductive ring in accordance with an exemplary embodiment.

FIG. 7 is top view of a RF conductive ring 400 in accordance with an exemplary embodiment. As shown in FIG. 7, the RF conductive ring 400 is an annular ring 410 having a relatively uniform thickness with an annular recess 420 on an inner portion thereof 430, which is configured to extend underneath the outer edge 222 of the wafer 220. In accordance with an exemplary embodiment, the RF conductive ring 400 is made of silicon carbide (SiC) having a resistivity of less than about 100 Ohm-cm. In accordance with an exemplary embodiment, the RF conductive ring 400 can be made of doped silicon (Si). In accordance with an exemplary embodiment, the RF conductive edge ring 400 can be incorporated into the baseplate 210, for example, within an electrostatic chuck assembly (ESC).

Figure 8:
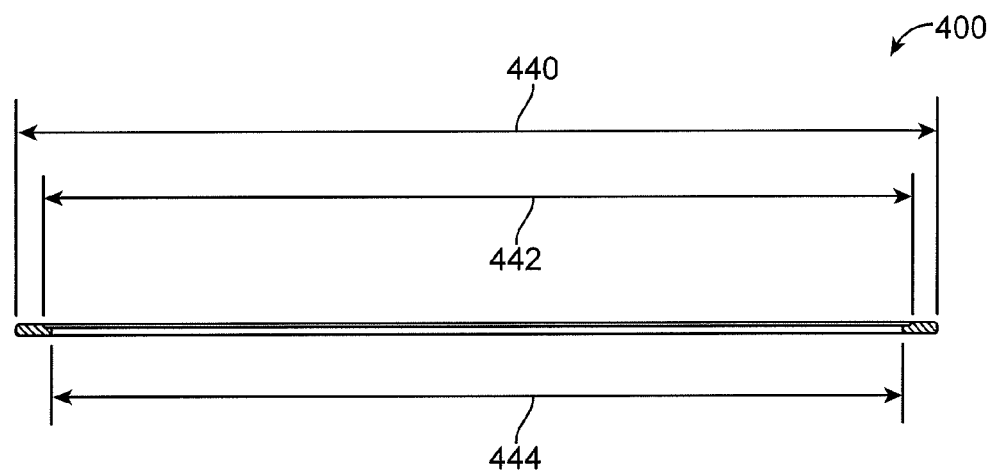
FIG. 8 is a cross-sectional view of the RF conductive ring as shown in FIG. 7 along the line 8-8 in accordance with an exemplary embodiment.

FIG. 8 is a cross-sectional view of the RF conductive ring 400 as shown in FIG. 7 in along the line 8-8 in accordance with an exemplary embodiment. As shown in FIG. 8, in accordance with an exemplary embodiment, the RF conductive ring 400 can have an outer diameter 440 of about 12.620 inches and an inner diameter 444 of about 11.636 inches. In accordance with an exemplary embodiment, the RF conductive ring 400 can have an inner diameter 442 from the inner vertical recess wall 424 (FIG. 9) of the annular recess 420 of about 11.905 inches.

Figure 9:
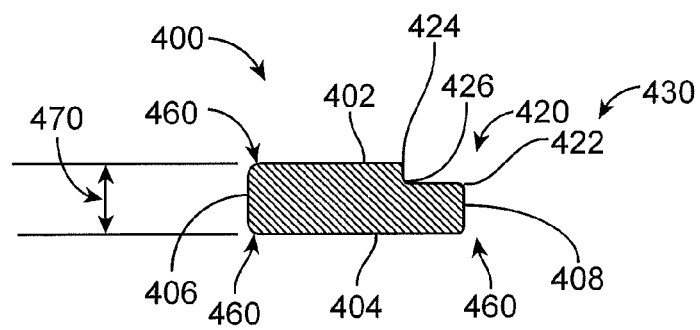
FIG. 9 is a cross-sectional view of the RF conductive ring in accordance with an exemplary embodiment.

FIG. 9 is a cross-sectional view of the RF conductive ring 400 as shown in FIG. 7 in accordance with an exemplary embodiment. As shown in FIG. 9, the RF conductive ring 400 has a relatively horizontal upper surface or edge 402, a relatively horizontal lower surface or edge 404, relatively vertical outer edge 406, and a relatively vertical inner edge 408. The upper surface 402 and inner edge 408 extend inward to the annular recess 420, which is located on an upper portion of the inner edge 408 of the RF conductive ring 400. The annular recess 420 has an inner horizontal wall 422 and a vertical recess wall 424, which are connected to one another at a corner 426. The inner horizontal wall 422 can be about inches 0.189 inches in length. The vertical recess wall 424 can have a height of about 0.05 inches. In accordance with an exemplary embodiment, the RF conductive ring 400 can have a height 470 of about 0.165 inches and a width 472 of about 0.492 inches. In accordance with an exemplary embodiment, each of the outer edges 460 of the RF conduction ring 400 can be rounded and/or having a curvature thereto.

Figure 10:
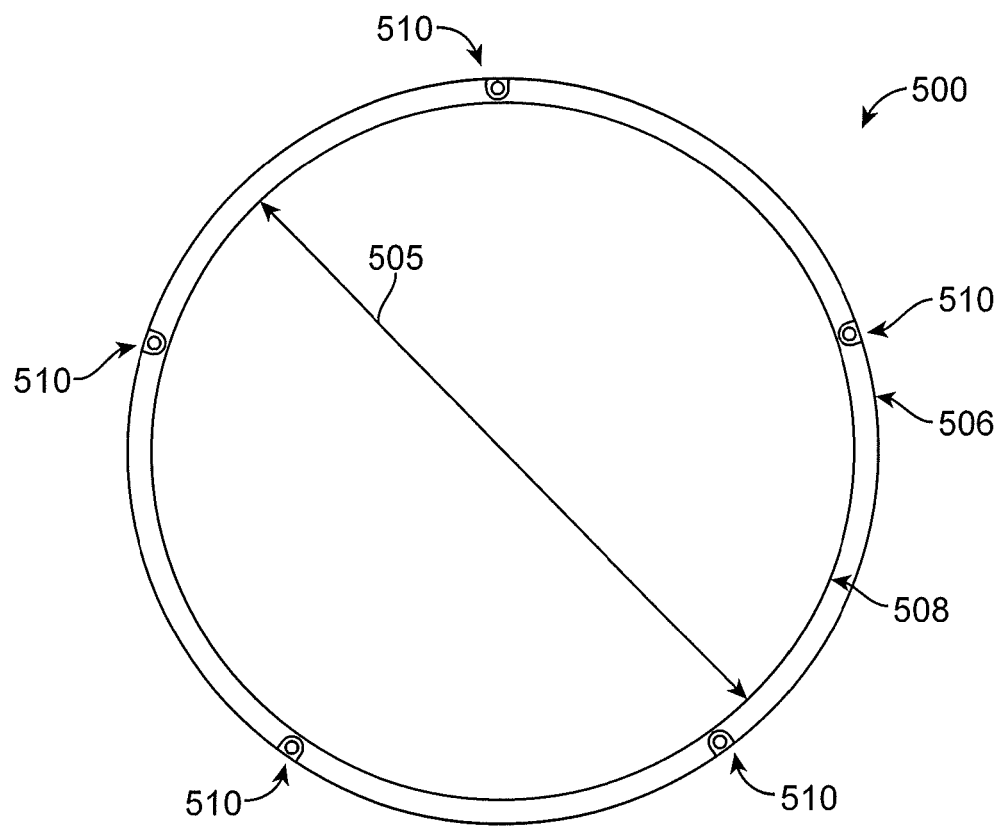
FIG. 10 is top view of a bottom ring in accordance with an exemplary embodiment.

FIG. 10 is top view of a bottom ring 500 in accordance with an exemplary embodiment. As shown in FIG. 10, the bottom ring 500 is an annular ring having an outer edge 506 and an inner edge 508. In accordance with an exemplary embodiment, the bottom ring 500 can have an inner diameter 505 of about 11.634 inches. The bottom ring 500 can be configured to rest on an upper or annular surface 212 of the baseplate 210. In accordance with an exemplary embodiment, the bottom ring 500 can be an anodized aluminum ring. The bottom ring 500 can have a generally rectangular cross-section, and can include a plurality of recesses 510, which are configured to be received within one or more circular protrusions (not shown) extending upward from the baseplate 210. In accordance with an exemplary embodiment, the bottom ring 500 is supported on the annular surface 212 of the baseplate 210 and surrounds the baseplate 210.

Figure 11:
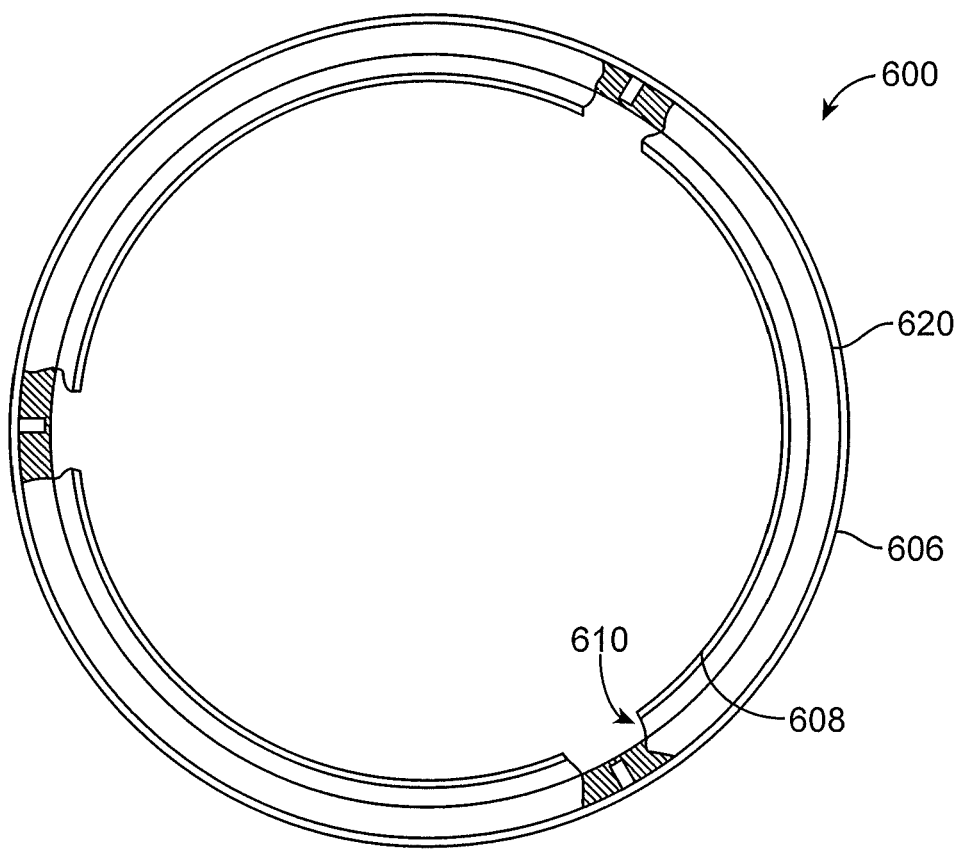
FIG. 11 is a top view of a quartz edge ring in accordance with an exemplary embodiment.

FIG. 11 is a top view of a quartz edge ring 600 in accordance with an exemplary embodiment. The quartz edge ring 600 is annular ring having an inner edge 608 and an outer edge 606. The quartz edge ring 600 is configured to surround an outer surface or edge 214 of the baseplate 210 and an outer edge 506 of the bottom ring 500. The quartz edge ring 600 can have a generally rectangular cross-section with one or more rounded edges thereto. In accordance with an exemplary embodiment, 600 the quartz edge ring 600 can have an inner recess 610 on a lower surface of the quartz edge ring 600 and/or an outer flange 620 on an outer portion of the quartz edge ring 600.

Figure 12:
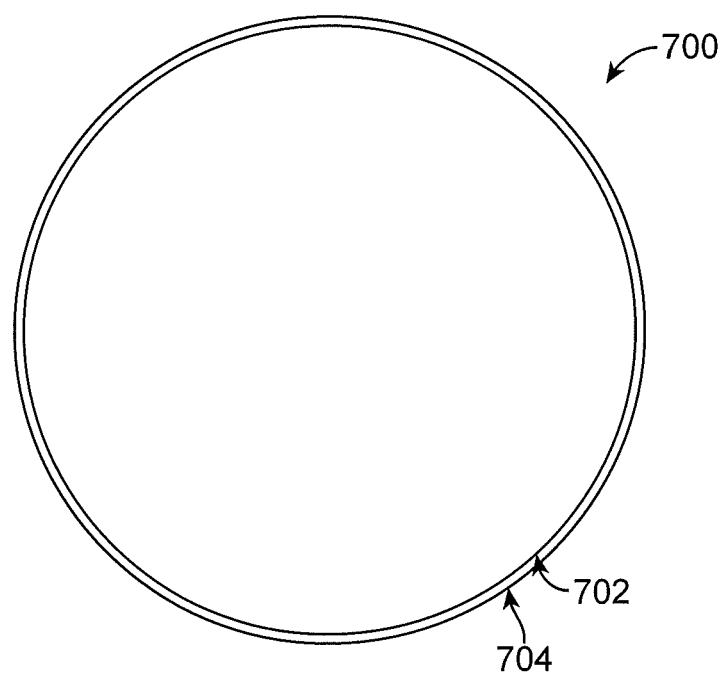
FIG. 12 is a top view of a centering ring in accordance with an exemplary embodiment.

FIG. 12 is a top view of a centering ring 700 in accordance with an exemplary embodiment. The centering ring 700 is annular ring having an inner edge 702 and an outer edge 704. The centering ring 700 is configured to surrounds an outer edge 606 (FIG. 2) of the quartz ring 600 and extends upward to the center recess 340 within the wafer edge protection ring 300. The centering ring 700 can have a generally rectangular cross-section with one or more rounded edges thereto.

When the word "about" is used in this specification in connection with a numerical value, it is intended that the associated numerical value include a tolerance of ±10% around the stated numerical value.

Moreover, when the words "generally", "relatively", and "substantially" are used in connection with geometric shapes, it is intended that precision of the geometric shape is not required but that latitude for the shape is within the scope of the disclosure. When used with geometric terms, the words "generally", "relatively", and "substantially" are intended to encompass not only features which meet the strict definitions but also features which fairly approximate the strict definitions.

It is to be understood that the form of this invention as shown is merely a preferred embodiment. Various changes may be made in the function and arrangement of parts; equivalent means may be substituted for those illustrated and described; and certain features may be used independently from others without departing from the spirit and scope of the invention as defined in the following claims.

What is claimed is:

1. An edge ring assembly for use in a plasma processing chamber, comprising:
   an RF conductive ring positioned on an annular surface of a base plate and configured to surround an upper portion of the base plate and extend underneath an outer edge of a wafer positioned on an upper surface of the base plate; and
   a wafer edge protection ring positioned above an upper surface of the RF conductive ring and configured to extend over the outer edge of the wafer, the wafer edge protection ring having an inner annular edge portion with a uniform thickness, which is configured to extend over the outer edge of the wafer, a conical upper surface extending outward from the inner annular edge portion to a horizontal upper surface, and an inner annular recess which is positioned on the upper surface of the RF conductive ring and configured to extend over the outer edge of the wafer, the inner annular recess having a horizontal inner lower surface, which is positioned above the upper surface of the RF conductive ring, and wherein the horizontal inner lower surface extends outward from an inner vertical wall of the inner annular edge portion horizontally to an inner vertical wall of the inner annular recess, and the inner vertical wall of the inner annular recess being adjacent to an outer edge of the RF conductive ring, and wherein the horizontal inner lower surface of the wafer edge protection ring does not contact the RF conductive ring.

2. The assembly of claim 1, comprising:
   a bottom ring configured to be supported on the annular surface of the base plate and positioned between the RF conductive ring and the annular surface of the base plate.

3. The assembly of claim 2, comprising:
   a quartz ring surrounding an outer surface of the base plate and an outer edge of the bottom ring.

4. The assembly of claim 3, comprising:
   a centering ring surrounding an outer edge of the quartz ring and extending upward to a center annular recess within the wafer edge protection ring.

5. The assembly of claim 2, wherein the bottom ring is an aluminum ring.

6. The assembly of claim 2, wherein the bottom ring is an anodized aluminum ring.

7. The assembly of claim 1, wherein the RF conductive ring has an annular recess on an inner portion of the RF conductive ring, and wherein the annular recess is configured to extend underneath the outer edge of the wafer.

8. The assembly of claim 1, wherein the wafer edge protection ring has a center annular recess which is configured to receive a centering ring, and at least three recesses, each of the at least three recesses configured to receive a ceramic lift rod, which raises the wafer edge protection ring upward during wafer transfer.

9. The assembly of claim 1, wherein the inner annular edge portion of the wafer edge protection ring has a thickness of about 0.030 inches to 0.060 inches.

10. The assembly of claim 1, wherein the wafer edge protection ring is configured to extend about 0.5 mm to 3.0 mm over the outer edge of the wafer.

11. The assembly of claim 1, wherein the wafer edge protection ring does not contact the wafer.

12. The assembly of claim 1, wherein the RF conductive ring is made of silicon carbide (SiC) and has a resistivity of less than about 100 Ohm-cm.

13. The assembly of claim 1, wherein the RF conductive ring is made of doped silicon (Si).

14. The assembly of claim 1, wherein the wafer edge protection ring is made out of an RF conductive material.

15. A lower electrode assembly for use in a plasma processing chamber, comprising:
   a base plate configured to receive a wafer on an upper surface of the base plate;
   a bottom ring supported on an annular surface of the base plate and surrounding the base plate;
   an RF conductive ring positioned on an upper surface of the bottom ring and surrounding an upper portion of the base plate and configured to extend underneath an outer edge of the wafer positioned on the upper surface of the base plate;
   a wafer edge protection ring positioned above an upper surface of the RF conductive ring and configured to extend over the outer edge of the wafer, the wafer edge protection ring having an inner annular edge portion with a uniform thickness, which is configured to extend over the outer edge of the wafer, a conical upper surface extending outward from the inner annular edge portion to a horizontal upper surface, and an inner annular recess which is positioned on the upper surface of the RF conductive ring and configured to extend over the outer edge of the wafer, the inner annular recess having a horizontal inner lower surface, which is positioned above the upper surface of the RF conductive ring, and wherein the horizontal inner lower surface extends outward from an inner vertical wall of the inner annular edge portion horizontally to an inner vertical wall of the inner annular recess, the inner vertical wall of the inner annular recess being adjacent to an outer edge of the RF conductive ring, and
   a quartz ring surrounding an outer surface of the base plate and an outer edge of the bottom ring; and
   a centering ring surrounding an outer edge of the quartz ring and extending upward to a center annular recess within the wafer edge protection ring.

16. The lower electrode assembly of claim 15, wherein the RF conductive ring has an annular recess on an inner portion of the RF conductive ring, and wherein the annular recess is configured to extend underneath the outer edge of the wafer.

17. The lower electrode assembly of claim 15, wherein the wafer edge protection ring has at least three recesses, each of the at least three recesses configured to receive a ceramic lift rod, which raises the wafer edge protection ring upward during wafer transfer.

18. The lower electrode assembly of claim 15, wherein the inner annular edge portion of the wafer edge protection ring has a thickness of about 0.030 inches to 0.060 inches.

19. The lower electrode assembly of claim 15, wherein the wafer edge protection ring is configured to extend about 0.5 mm to 3.0 mm over the outer edge of the wafer.

20. The lower electrode assembly of claim 15, wherein the wafer edge protection ring does not contact the wafer.

21. The lower electrode assembly of claim 15, wherein the RF conductive ring is made of silicon carbide (SiC) and has a resistivity of less than about 100 Ohm-cm.

22. The lower electrode assembly of claim 15, wherein the RF conductive ring is made of doped silicon (Si).

23. The lower electrode assembly of claim 15, wherein the wafer edge protection ring is made out of an RF conductive material.

24. The lower electrode assembly of claim 15, wherein the bottom ring is an aluminum ring.

25. The lower electrode assembly of claim 15, wherein the bottom ring is an anodized aluminum ring.

26. The lower electrode assembly of claim 15, wherein the base plate is an electrostatic chuck assembly (ESC).

* * * * *